(12) United States Patent
Kontani et al.

(10) Patent No.: US 6,345,506 B1
(45) Date of Patent: Feb. 12, 2002

(54) APPARATUS FOR CONTROLLING TEMPERATURE OF FLUID BY USE OF THERMOELECTRIC DEVICE

(75) Inventors: Tatsuo Kontani, Mino; Kantaro Aoki, Shimizu, both of (JP)

(73) Assignee: CSE Inc., Osaka (JP)

( * ) Notice: Subject to any disclaimer, the term of this patent is extended or adjusted under 35 U.S.C. 154(b) by 0 days.

(21) Appl. No.: 09/514,308

(22) Filed: Feb. 28, 2000

(30) Foreign Application Priority Data

Mar. 18, 1999 (JP) .......................................... 11-073735

(51) Int. Cl.$^7$ ................................................ F25B 21/02
(52) U.S. Cl. .................................. 62/3.2; 62/3.3; 62/3.7
(58) Field of Search .............................. 62/3.7, 3.3, 3.2

(56) References Cited

U.S. PATENT DOCUMENTS

| | | | |
|---|---|---|---|
| 4,476,685 A | * 10/1984 | Aid ................................... | 62/3 |
| 5,590,532 A | * 1/1997 | Bachman ...................... | 62/3.3 |
| 5,613,364 A | 3/1997 | Higgins | |
| 5,802,856 A | * 9/1998 | Schaper et al. ................ | 62/3.7 |
| 5,865,031 A | 2/1999 | Itakura | |
| 5,899,077 A | * 5/1999 | Wright et al. .................. | 62/3.7 |
| 5,975,856 A | * 11/1999 | Welle ........................... | 417/53 |
| 6,007,302 A | * 12/1999 | Welle ........................... | 417/52 |
| 6,018,616 A | * 1/2000 | Schaper ....................... | 392/418 |

FOREIGN PATENT DOCUMENTS

| | | |
|---|---|---|
| EP | 0 838 867 A2 | 4/1998 |
| GB | 2 090 059 A | 6/1982 |
| JP | 11101525 | 4/1999 |

* cited by examiner

Primary Examiner—William Doerrler
Assistant Examiner—Mark Shulman
(74) Attorney, Agent, or Firm—Rader, Fishman & Grauer, PLLC

(57) ABSTRACT

An apparatus for controlling the temperature of a fluid by use of a thermoelectric device comprises at least one temperature control unit, which is composed of a first heat-transfer member having at least one channel, through which the fluid flows, a pair of thermo-modules each incorporating the thermoelectric device, which are placed on opposite surfaces of the first heat-transfer member, and a pair of second heat-transfer members, each of which has a flange on its periphery and is placed on the thermo-module. The temperature control unit is stably held between a pair of holding frames each having an aperture such that each of the holding frames is pressed against the flange of the second heat-transfer member through a sealing material having elasticity, and a part of the second heat-transfer member is exposed through the aperture. This apparatus is capable of cooling the fluid without chlorofluorocarbons (CFCs) used as a coolant for conventional refrigerators.

18 Claims, 18 Drawing Sheets

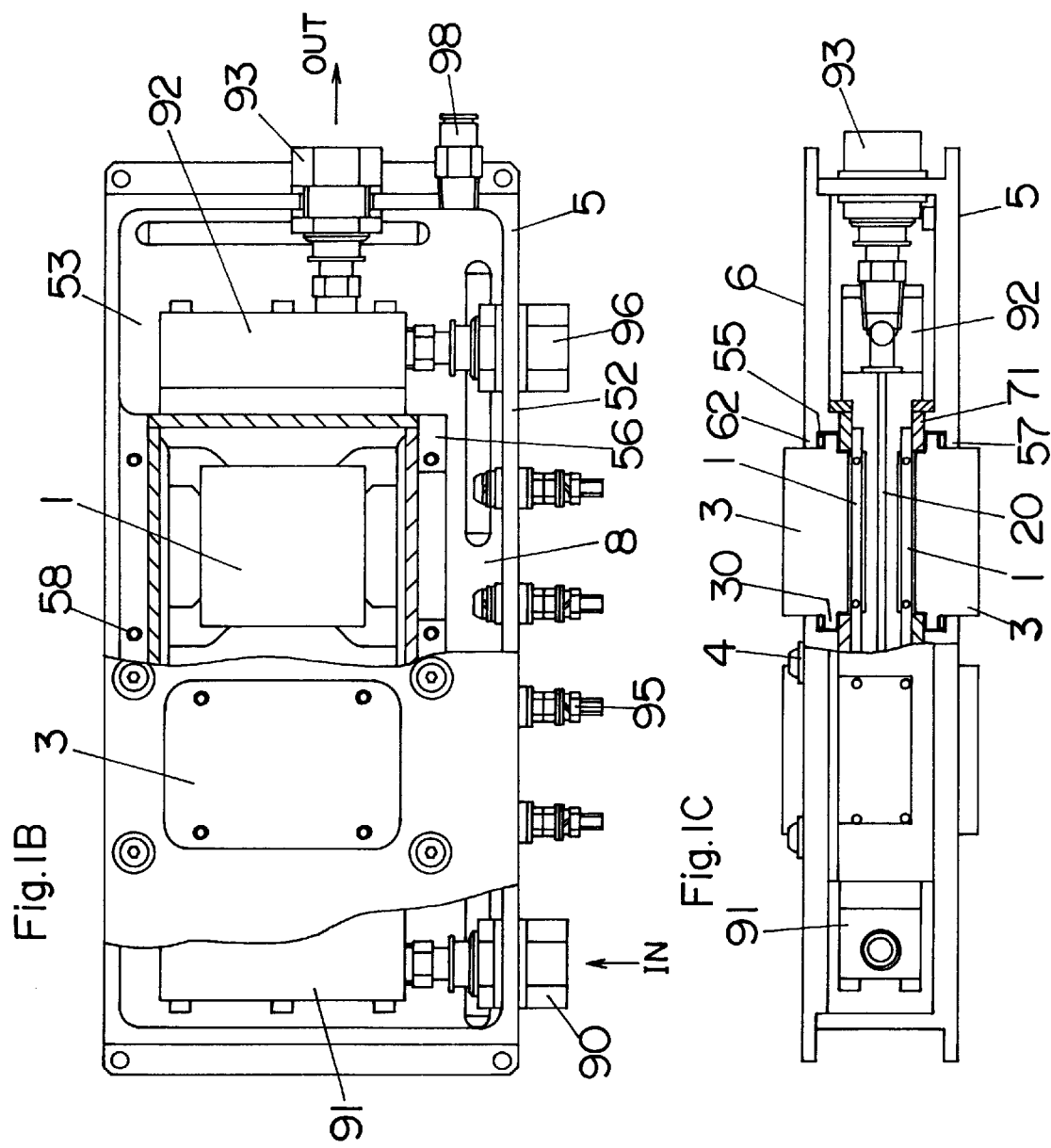

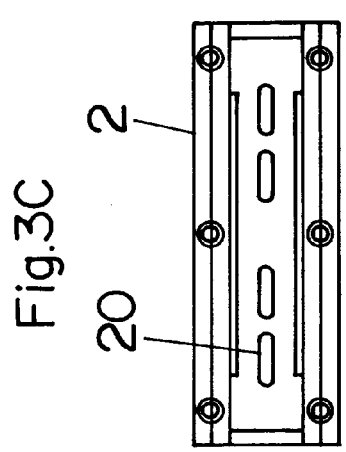
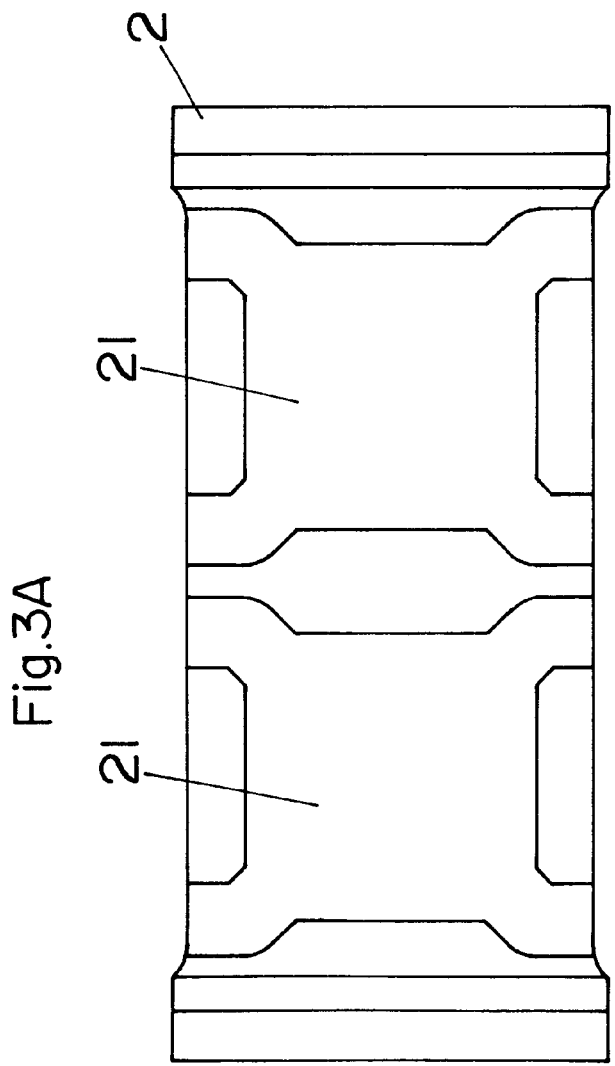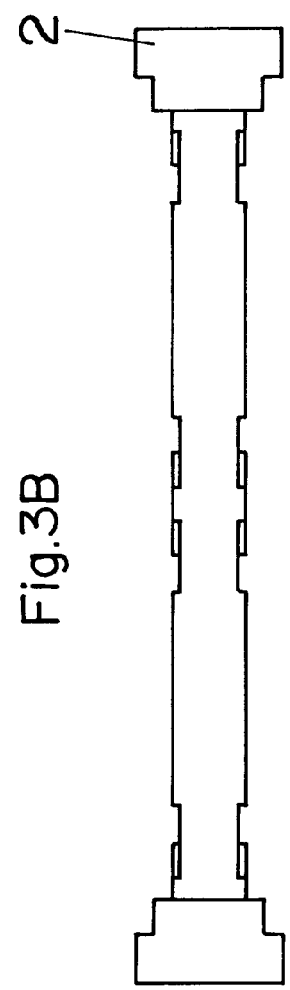

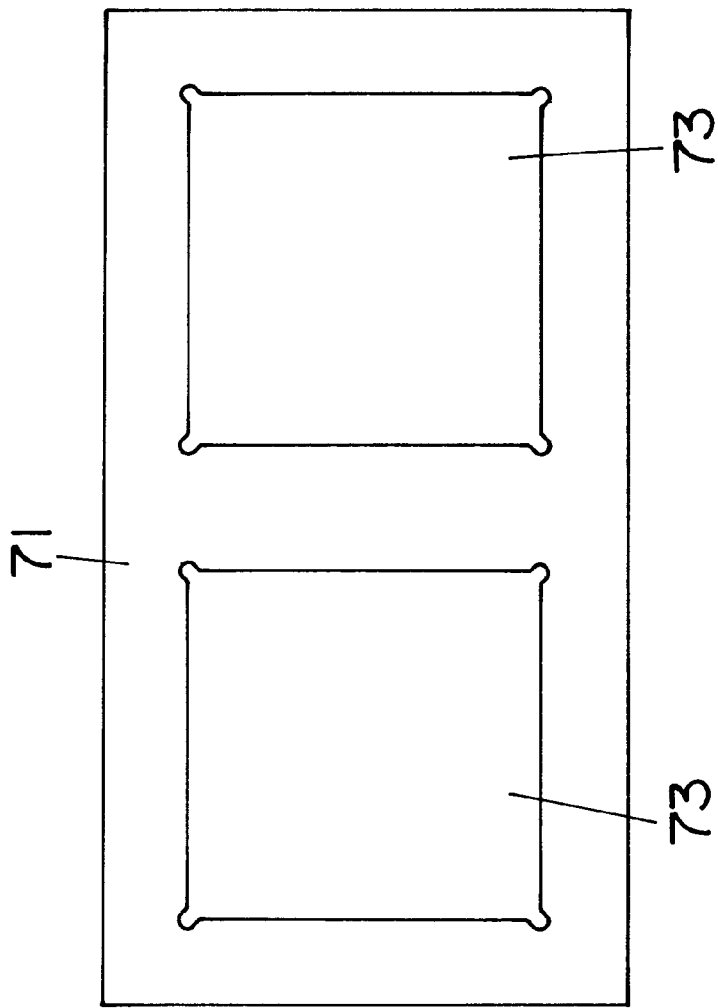

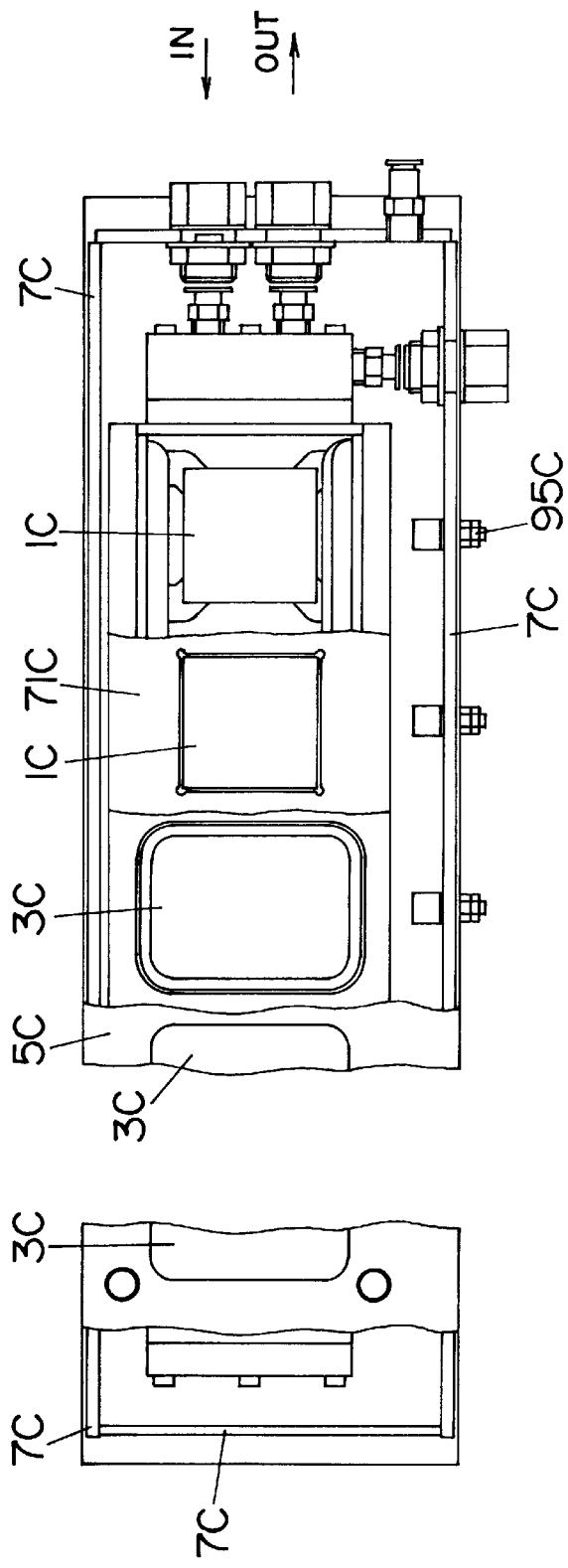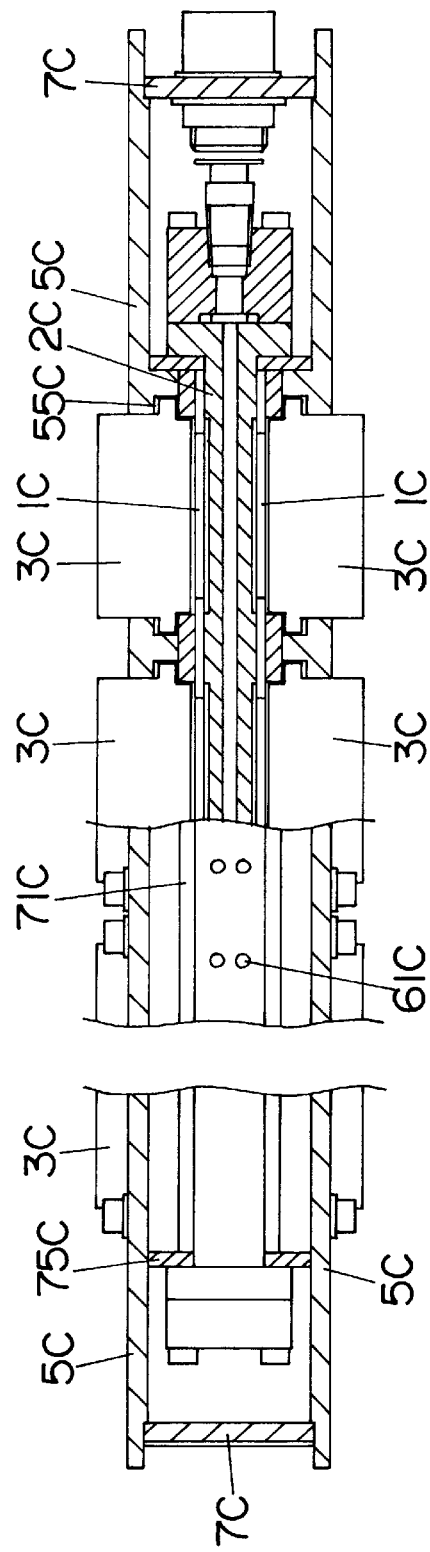

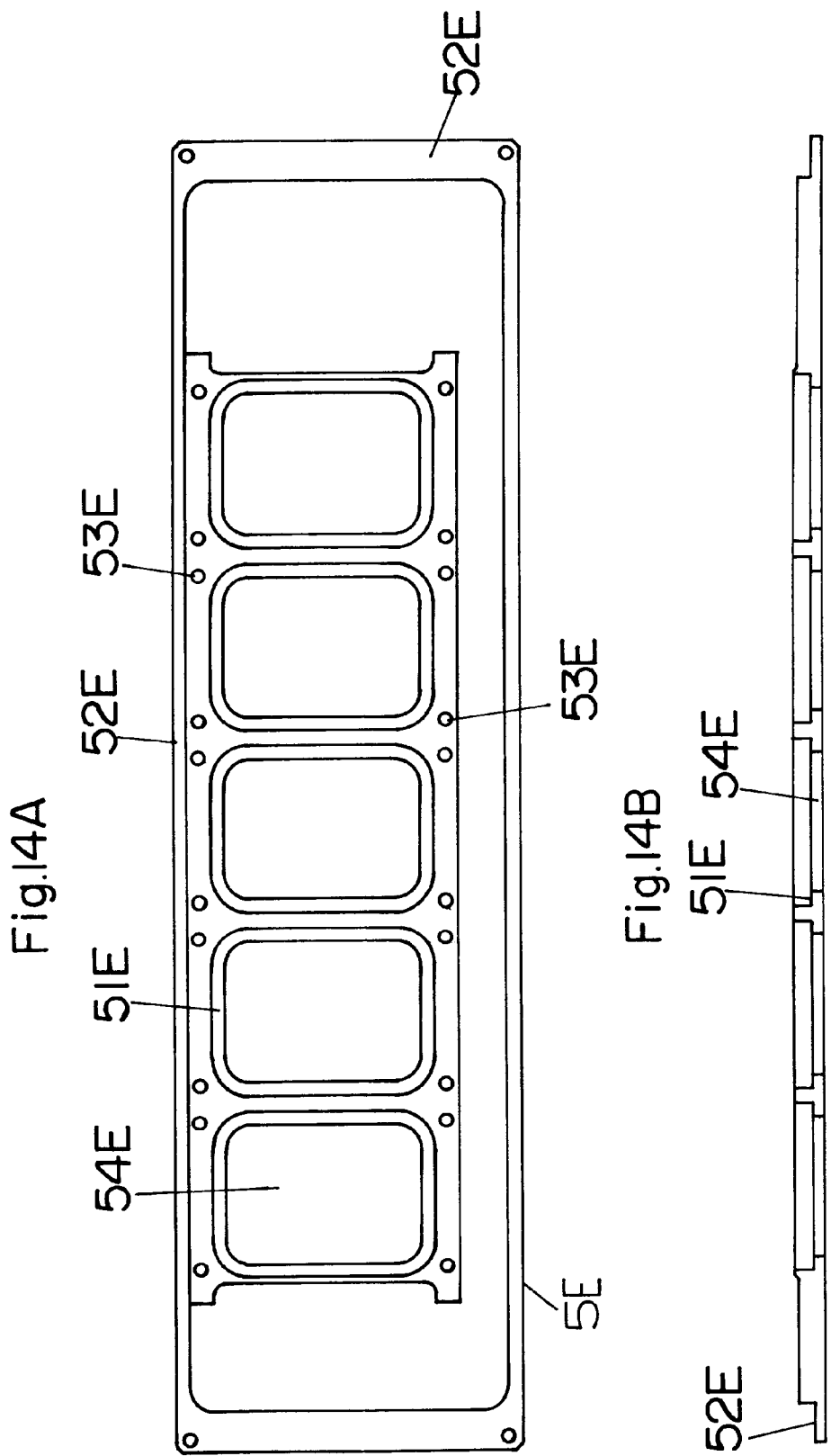

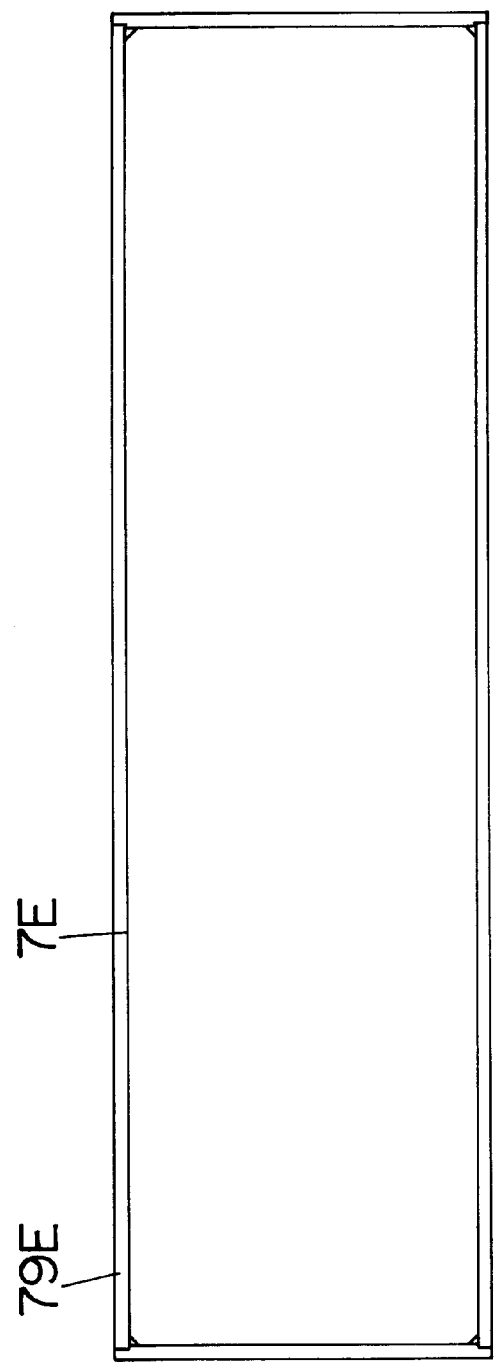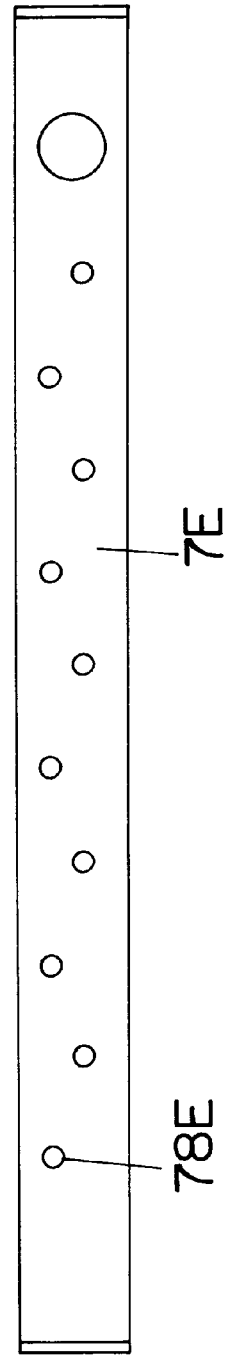

APPARATUS FOR CONTROLLING TEMPERATURE OF FLUID BY USE OF THERMOELECTRIC DEVICE

BACKGROUND OF THE INVENTION

1. Field of the Invention

The present invention relates to an apparatus for controlling the temperature of a fluid by use of a thermoelectric device that is often called Peltier device.

2. Disclosure of the Prior Art

The destruction of the ozone layer caused by the constant release into the atmosphere of chemicals known as chlorofluorocarbons (CFCs) is a serious problem for the global environment. For example, the CFCs are used as a coolant for conventional refrigerators. From the viewpoint of the global environmental protection, development is going on to fine an alternative to the conventional refrigerators using the CFCs. In recent years, a cooling apparatus using a thermoelectric device that is often called Peltier device has gained attention.

FIG. 16 shows a schematic cross-sectional view of a conventional apparatus for controlling the temperature of a fluid by use of the thermoelectric device. This apparatus comprises a temperature control unit, which is composed of a first heat-transfer member 2S having channels 20S, through which the fluid flows, a pair of thermo-modules 1S each incorporating the thermoelectric device, and a pair of second heat-transfer members 3S each having a flange 30S on its periphery. When an electric current is supplied to the thermo-module 1S of the temperature control unit, one side of the thermo-module acts as a heat absorption means of absorbing heat from the fluid flowing in the channels 20S through the first heat-transfer member 2S, and the opposite side of the thermo-module 1S acts as a heat radiation means of radiating heat toward the second heat-transfer member 3S. Therefore, the temperature control unit is capable of cooling the fluid without using the CFCs.

The temperature control unit is held by use of fixtures 4S such as bolts 41S and nuts 42S. In FIG. 16, the numeral 35S designates a through-hole for the use of the bolt 41S, which is formed in the flange 30S of the second heat-transfer member 3S. After the first heat-transfer member 2S and the thermo-modules 1S are put between the second heat-transfer members 3S, the second heat-transfer members are joined by the bolts 41S and the nuts 42S.

By the way, when the apparatus is operated, a thermal stress occurs in the temperature control unit. Since the temperature control unit rigidly held by use of the bolts 41S and the nuts 42S can not release the thermal stress, there is a problem that the thermo-modules 1S are often broken by the thermal stress. Overtightening the bolts 41S may also lead to a breakage of the thermo-modules 1S. Thus, the apparatus still has plenty of room for improvement.

SUMMARY OF THE INVENTION

To solve the above-described problems, the present invention provides an improved apparatus for controlling the temperature of a fluid by use of a thermoelectric device. The apparatus comprises at least one temperature control unit, which is composed of a thermo-module incorporating the thermoelectric device, first heat-transfer member, and a second heat transfer member having a flange on its periphery. The first heat-transfer member has at least one channel, through which the fluid flows. The thermo-module is placed on the first heat-transfer member. The second heat-transfer member is placed on the thermo-module. The temperature control unit is held by use of a case and a cover. The case has an opening, through which the temperature control unit is mounted in the case. The cover is used to close the opening of the case. One of the case and the cover is formed with an aperture for exposing a part of the second heat-transfer member, and a first flange extending around the aperture. The first flange is pressed against the flange of the second heat-transfer member through a sealing material having elasticity. The first heat-transfer member and the thermo-module of the temperature control unit are disposed in an enclosed space between the case and the cover.

In addition, the present invention provides an improved apparatus for controlling the temperature of a fluid by use of a thermoelectric device, as described below. The apparatus comprises at least one temperature control unit, which is composed of a first heat-transfer member, a pair of thermo-modules each incorporating the thermoelectric device, and a pair of second heat-transfer members each having a flange on its periphery. The first heat-transfer member has at least one channel, through which the fluid flows. The thermo-modules are placed on opposite surfaces of the first heat-transfer member. Each of the second heat-transfer members is placed on the thermo-module. The temperature control unit is held by use of a case and a cover. The case has an opening, through which the temperature control unit is mounted in the case. The cover is used to close the opening of the case. The case is formed with a first aperture for exposing a part of one of the second heat-transfer members, and a first flange extending around the first aperture. The first flange of the case is pressed against the flange of one of the second heat-transfer members through a sealing material having elasticity. The cover is formed with a second aperture for exposing a part of the other one of the second heat-transfer members, and a second flange extending around the second aperture. The second flange of the cover is pressed against the flange of the other one of the second heat-transfer members through a sealing material having elasticity. The first heat-transfer member and the thermo-modules of the temperature control unit are disposed in an enclosed space between the case and the cover.

In addition, the present invention provides an improved apparatus for controlling the temperature of a fluid by use of a thermoelectric device, as described below. The apparatus comprises at least one temperature control unit, which is composed of a first heat-transfer member, a pair of thermo-modules each incorporating the thermoelectric device, and a pair of second heat-transfer members each having a flange on its periphery. The first heat-transfer member has at least one channel, through which the fluid flows. The thermo-modules are placed on opposite surfaces of the first heat-transfer member. Each of the second heat-transfer members is placed on the thermo-module. The temperature control unit is held by use of a pair of holding frames each having an aperture. The temperature control unit is held between the holding frames such that each of the holding frames is pressed against the flange of the second heat-transfer member through a sealing material having elasticity, and a part of the second heat-transfer member is exposed through the aperture.

Since the apparatus of the present invention has a structure that the temperature control unit is held by repulsion of the sealing material having elasticity, it is possible to protect the thermo-module(s) from the thermal stress.

These and other objects and advantages will become apparent from the following detailed description of the preferred embodiments of the invention.

BRIEF DESCRIPTION OF THE DRAWINGS

FIGS. 1A to 1C are respectively cross-sectional view, cutaway top and side views of an apparatus for controlling the temperature of a fluid according to a first embodiment of the present invention;

FIGS. 3A to 3C are top, side and front views of a first heat-transfer member, respectively;

FIGS. 5A and 5B are top and side views of a first heat insulator, respectively;

FIGS. 8A to 8C are respectively cross-sectional view, cutaway top and side views of an apparatus for controlling the temperature of a fluid according to a third embodiment of the present invention;

FIGS. 14A and 14B are top and side views of a lower holding frame of the fifth embodiment, respectively;

FIGS. 15A and 15B are top and side views of a sidewall member of the fifth embodiment, respectively.

DETAIL DESCRIPTION OF THE PREFERRED EMBODIMENTS

Referring to the attached drawings, the present invention is explained in detail.

First Embodiment

Figure 1A:
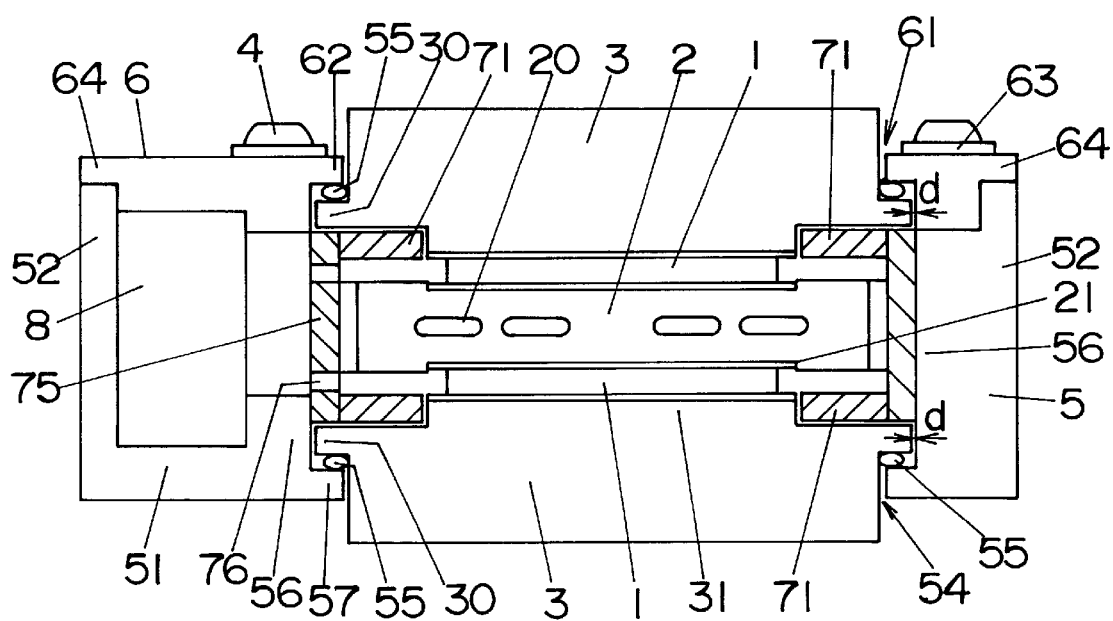

As shown in FIGS. 1A to 1C, an apparatus for controlling the temperature of a fluid according to a first embodiment of the present invention has two temperature control units in series. Each of the temperature control units comprises a first heat-transfer member 2 having channels 20, through which the fluid flows, a pair of thermo-modules 1 each incorporating a thermoelectric device that is often called Peltier device, and a pair of second heat-transfer members 3 for transferring heat radiated from the thermo-modules 1.

Figure 2:
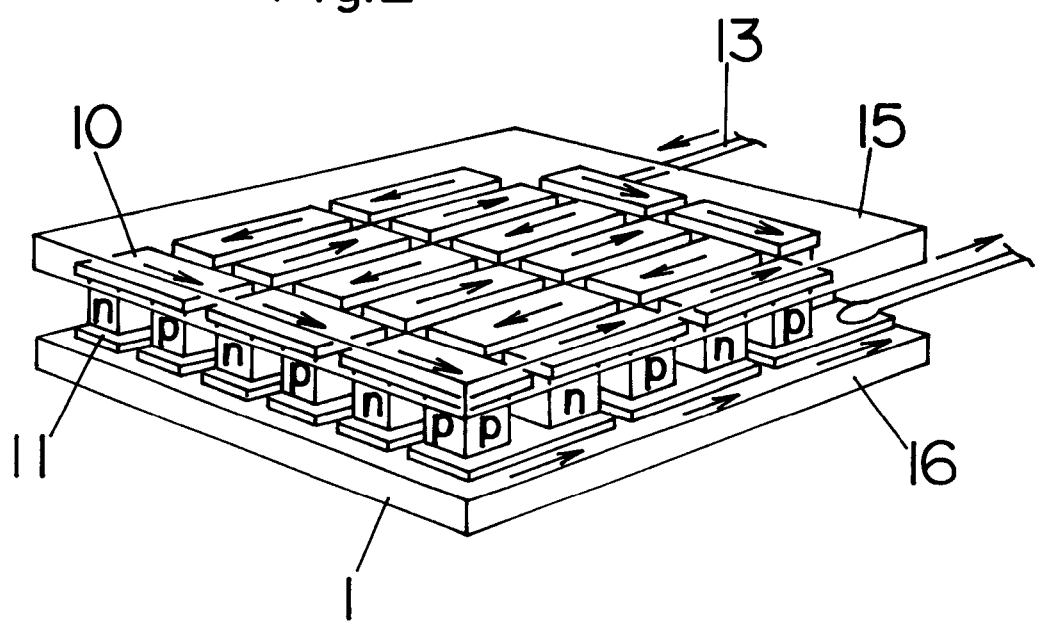
FIG. 2 is a perspective view of a thermo-module.

The thermo-module 1 has a structure that N-type and P-type semiconductors are arranged between upper and lower electrodes 10, 11, as shown in FIG. 2, and ceramic plates 15, 16 are placed on the upper and lower electrodes, respectively. Since the principle of the thermo-module has been previously known, its detail explanation is omitted. In brief, when a direct current is supplied to the thermo-module 1 through a lead wire 13, as shown in FIG. 2, it flows from the N-type semiconductor toward the P-type semiconductor in each of the upper electrodes 10. In this case, the upper electrodes 10 absorb heat from the surroundings. Therefore, the ceramic plate 15 on the upper electrodes 10 provides a heat-absorption surface. On the contrary, the direct current flows from the P-type semiconductor toward the N-type semiconductor in each of the lower electrodes 11. In this case, the lower electrodes 11 radiate heat to the surroundings. Therefore, the ceramic plate 16 on the lower electrodes 11 provides a heat-radiation surface. Thus, the thermo-module 1 is defined as a kind of heat pump for pumping heat from the heat-absorption surface toward the heat-radiation surface. When the polarity of current is reversed, the above relation between heat absorption and heat radiation is inverted.

The first heat-transfer member 2 is disposed between the thermo-modules 1. The first heat-transfer member 2 is formed in its upper and lower surfaces with concaves 21, each of which has a depth as substantially same as a thickness of the ceramic plate 15. The ceramic plate 15 is placed in the concave 21 through a silicon compound. Since the concave 21 is slightly larger than the ceramic plate 15, the ceramic plate slidably contacts the first heat-transfer member 2 in the concave. It is preferred that the first heat-transfer member 2 is made of a metal material having excellent thermal conductivity such as aluminum. In this embodiment, as shown in FIG. 3A to 3C, first heat-transfer members of the adjacent temperature control units are provided as a common heat-transfer member 2, in which the channels 20 extend. The shape of the individual channel 20 is not limited, however, the channel shape shown in FIG. 3C is effective to uniformly cool the fluid and enhance the cooling efficiency.

Figure 4C:
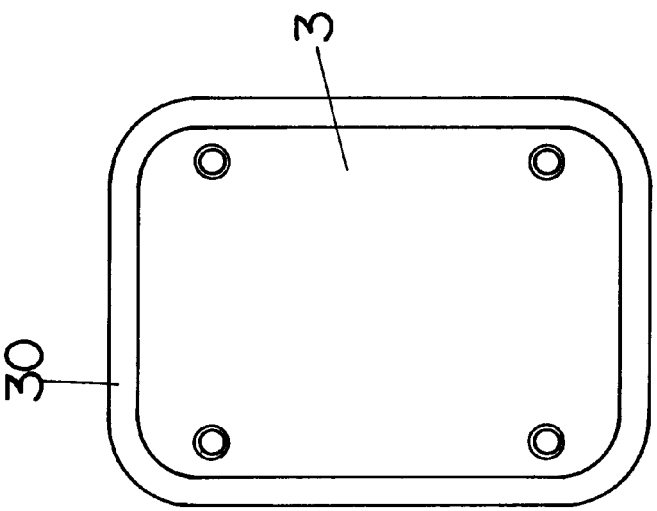
FIGS. 4A to 4C are top, side and bottom views of a second heat-transfer member, respectively.
Figure 4B:
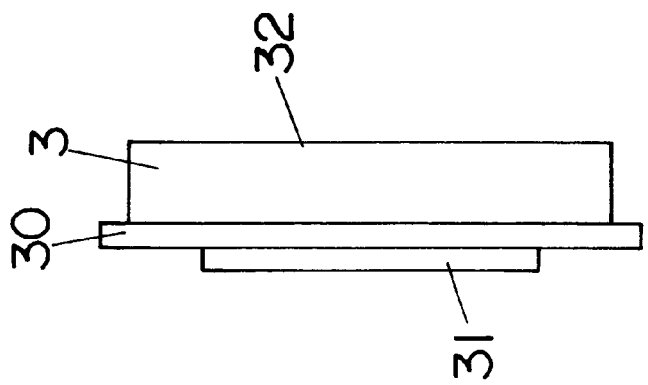
Figure 4A:
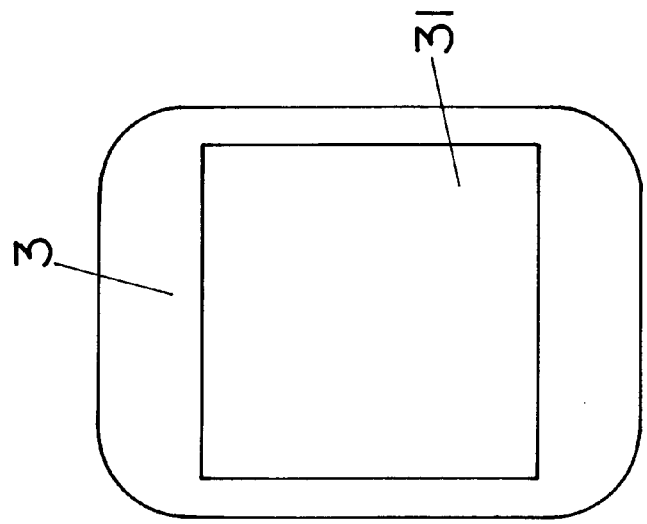

Each of the second heat-transfer members 3 is disposed on the ceramic plate 16 of the thermo-module 1 through a silicon compound. That is, as shown in FIGS. 4A to 4C, the second heat-transfer member 3 is formed with a convex 31 having a top surface which makes contact with the ceramic plate 16, a heat-radiation surface 32 extending opposite to the top surface of the convex 31, and a flange 30 on its periphery. The ceramic plate 16 slidably contacts the second heat-transfer member 2 on the convex 31. It is preferred that the second heat-transfer member 3 is made of a metal material having excellent thermal conductivity such as aluminum.

Thus, the temperature control unit is provided as an assembly of the thermo-modules 1, the first and second heat-transfer members 2, 3. To stably hold the assembly, this embodiment uses a case 5 and a cover 6, as described in detail below.

As shown in FIGS. 1A to 1C, the case 5 is formed with a base 51, sidewall 52 on the periphery of the base, and a top opening 53, through which the temperature control unit is mounted into the case 5. The base 51 has a base opening 54 for exposing the heat radiation surface 32 of the second heat-transfer member 3 to the outside of the case 5, base flange 57 formed around the base opening, and a guide wall 56 formed adjacent to the base flange 57. The numeral 58 designates a screw hole for the use of a bolt 4. The case 5 can be made of a metal material such as aluminum or a resin material.

The cover 6 is shaped to close the top opening 53 of the case 5. The cover 6 has a cover opening 61 for exposing the heat radiation surface 32 of the second heat-transfer member 3, inner flange 62 extending around the cover opening, and an outer flange 64 used to make contact with a top end of the sidewall 52 through a sealing material (not shown). The numeral 63 designates a through-hole for the use of the bolt 4. The cover 6 can be made of a metal material such as aluminum or a resin material.

By use of the case 5 and cover 6, the present apparatus can be assembled according to the following procedure. First, one of the second heat-transfer members 3 is placed in the case 5 such that its heat radiation surface is exposed to the outside of the case through the base opening 54, and the flange 30 of the second heat-transfer member is pressed against the base flange 57 through a sealing material 55 having elasticity. As the sealing material 55, a conventional material having good elastic-deformation and sealing capability is available. For example, a rubber material for conventional O-rings such as silicon rubber or nitrile rubber can be used as the sealing material 55.

Then, one of the thermo-modules 1 is put on the convex 31 of the second heat-transfer member 3 through the silicon compound. In addition, a first heat insulator 71 is disposed around the convex 31 so as to be spaced from the second heat-transfer member by a predetermined distance. The first heat insulator 71 is useful to prevent reduction in cooling efficiency caused by the so-called heat bridge phenomenon, i.e., heat radiation through a space between the first and second heat-transfer members (2, 3). As shown in FIGS. 5A and 5B, the first heat insulator 71 has rectangular openings 73, into each of which the convex 31 of the second heat-transfer member 3 can be inserted.

Then, the first heat-transfer member 2 is disposed on the thermo-module 1 such that the ceramic plate 15 of the thermo-module 1 is placed in the concave 21 of the first heat-transfer member 2 through the silicon compound. In addition, a second heat insulator 75 is disposed between the first heat-transfer member 2 and the guide wall 56. The second heat insulator 75 is useful to prevent reduction in cooling efficiency caused by the heat bridge phenomenon, i.e., heat radiation through a space between the first heat-transfer member 2 and the guide wall 56.

Likewise, the other one of the thermo-modules 1 is placed on the first heat-transfer member 2 through the silicon compound, and then the other one of the second heat-transfer members 3 is put on the ceramic plate 16 of the thermo-module 1 through the silicon compound. In addition, the first heat insulator 71 is disposed around the convex 31 so as to be spaced from the second heat-transfer member 3 by the predetermined distance.

Then, the top opening 53 of the case 5 is closed by the cover 6, so that the heat radiation surface 32 of the second heat-transfer member 3 is exposed to the outside through the cover opening 61, and the inner flange 62 of the cover 6 is pressed against the flange 30 of the second heat-transfer member 3 through the sealing material 55 having elasticity. In addition, the outer flange 64 of the cover is pressed against the top end of the sidewall 52 of the case 5 through the sealing material (not shown). The thermo-modules 1 and the first heat-transfer member 2 of the temperature control unit are disposed in an enclosed space between the case 5 and the cover 6. It is preferred that the enclosed space is filled with an inert gas.

Finally, the bolts 4 securely hold the cover 6 to the case 5. The bolts are engaged to the screw holes 58 of the case through the through-holes 63 of the cover. Thus, the temperature control unit is stably held by use of the cover and the case.

Since the sealing material 55 acts as a cushion, a contact pressure between the thermo-module 1 and the second heat-transfer member 3 and a contact pressure between the thermo-module and the first heat-transfer member 2 are stably maintained during the operation of the apparatus. Therefore, it is possible to prevent the occurrence of inconvenience that a thermal stress caused in the temperature control unit by heat generation from the thermo-module 1 breaks the thermo-module.

In FIG. 1B, the numeral 90 designates a fluid inlet, through which the fluid is supplied into a first header 91 disposed in the case 5. The first header 91 supplies the fluid into the channels 20 of the first heat-transfer member 2 of the temperature control unit. Heat of the fluid is absorbed by the heat absorption side of the thermo-module 1 through the first heat-transfer member 2. On the other hand, heat generated from the heat-radiation side of thermo-module 1 is radiated through the second heat-transfer member 3. As described before, when the polarity of current supplied to the thermo-module 1 is reversed, the fluid flowing through the channels 20 can be heated.

The cooled fluid is sent to a second header 92. The second header provides the cooled fluid to the outside through a fluid outlet 93. In FIG. 1A, the numeral 76 designates a through-hole formed in the second heat insulator, through which the lead wires of the thermo-module 1 are drawn. In FIG. 1B, the numeral 95 designates a terminal, to which the lead wire of the thermo-module 1 is connected. The numeral 8 designates a space used for the connection between the lead wires of the thermo-modules and the terminals. The numeral 96 designates a joint for connecting a temperature sensor for measuring the temperature of the fluid. The numeral 98 designates a valve used for evacuation of the enclosed space between the case and the cover. The valve 98 can be also used to supply an inert gas such as nitrogen into the enclosed space.

Second Embodiment

Figure 6A:
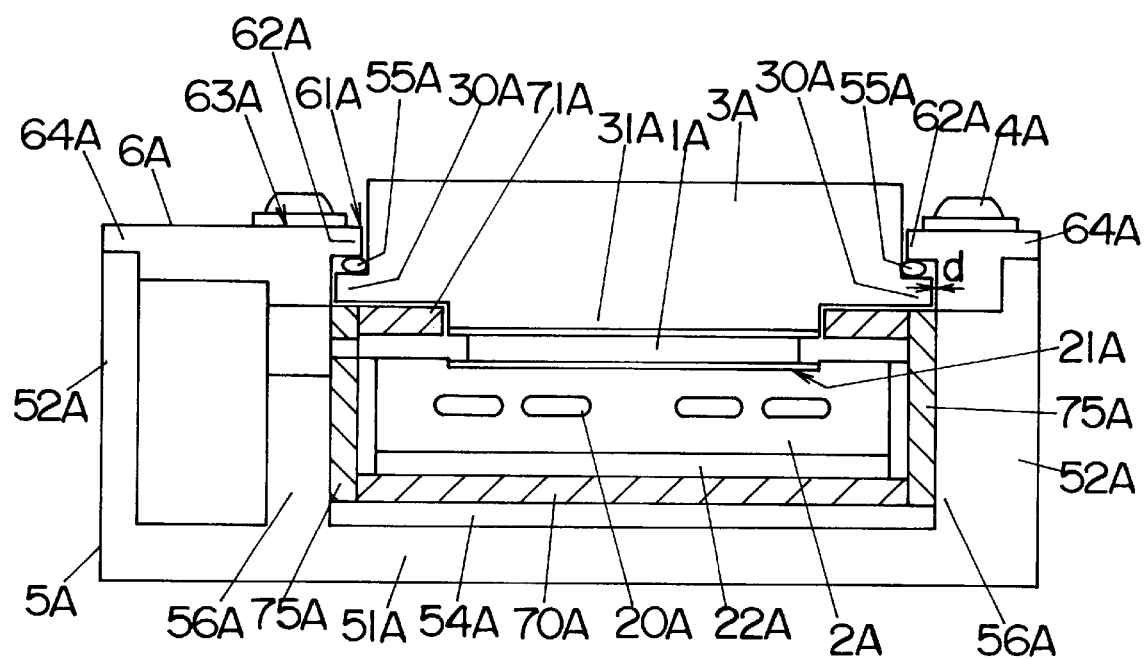
FIGS. 6A to 6C are respectively cross-sectional view, cutaway top and side views of an apparatus for controlling the temperature of a fluid according to a second embodiment of the present invention.
Figure 6B:
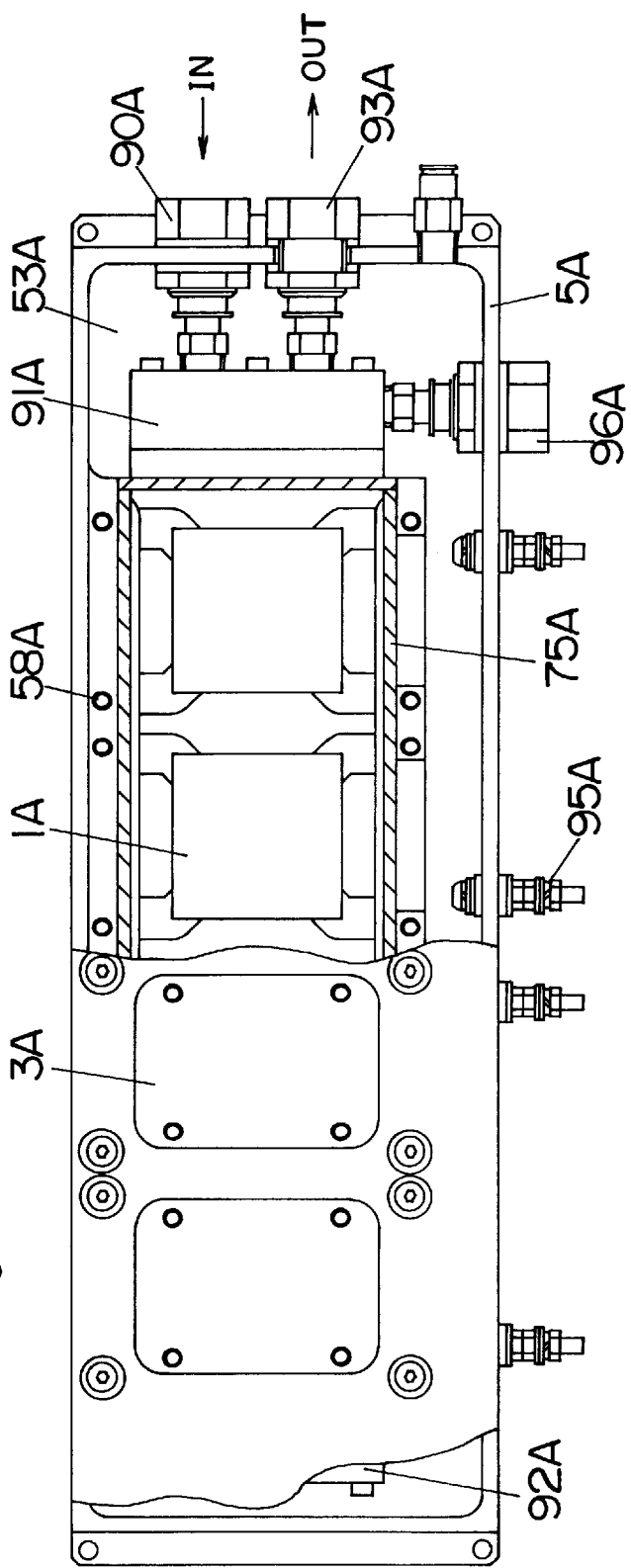
Figure 6C:
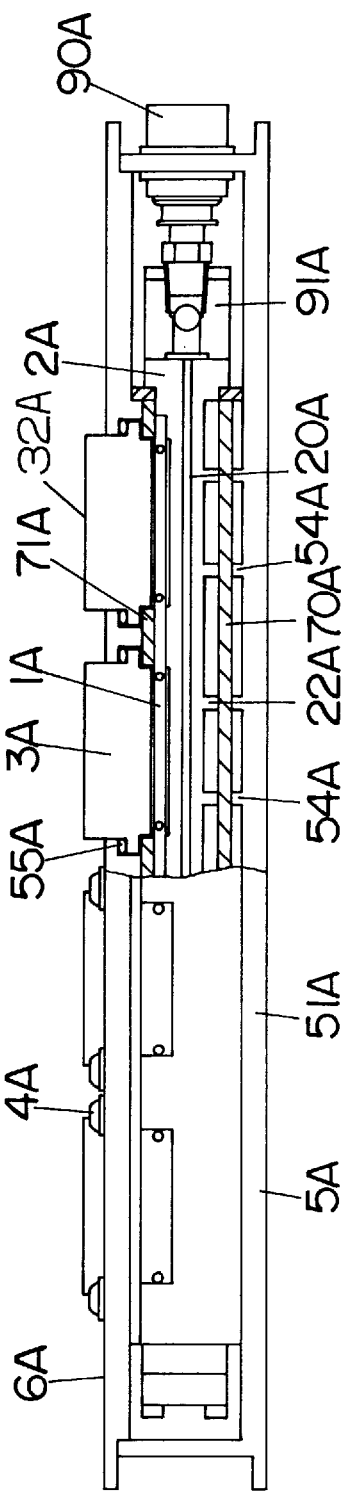

As shown in FIGS. 6A to 6C, an apparatus for controlling the temperature of a fluid according to a second embodiment of the present invention has four temperature control units in series. Each of the temperature control units is composed of a first heat-transfer member 2A having channels 20A, through which the fluid flows, a single thermo-module 1A incorporating a thermoelectric device that is often called Peltier device, and a single second heat-transfer member 3A for transferring heat radiated from the thermo-modules 1A. In the temperature control unit of the first embodiment, the two thermo-modules 1 are disposed on the opposite surfaces of the first heat-transfer member 2. In this embodiment, the thermo-module 1A is disposed on only one side of the first heat-transfer member 2A. As the thermo-module 1A and the second heat-transfer member 3A, it is possible to use those used in the first embodiment.

As shown in FIGS. 6B and 6C, the first heat-transfer members 2A of the four temperature control units in series are provided as a common first heat-transfer member, which is made of a metal material having excellent thermal conductivity such as aluminum. The first heat-transfer member 2A is formed in its upper surface with concaves 21A, each of which has a depth as substantially same as the thickness of a ceramic plate of the thermo-module 1A. The ceramic plate of the thermo-module 1A is placed in the concave 21A through a silicon compound. The first heat-transfer member 2A also has a plurality of projections 22A on its lower surface. A heat insulation board 70A is disposed on the projections 22A.

Thus, the temperature control unit is provided as an assembly of the thermo-module 1A, and the first and second heat-transfer members 2A, 3A. To stably hold the assembly, this embodiment uses a case 5A and a cover 6A, as described in detail below.

The case 5A is formed with a base 51A, sidewall 52A on the periphery of the base, and a top opening 53A through which the temperature control unit is mounted into the case 5. The base 51A has a plurality of base projections 54A, and a guide wall 56A formed around the projections. The numeral 58A designates a screw hole 58 for the use of a bolt 4A.

On the other hand, the cover 6A is shaped to close the top opening 53A of the case 5A. The cover 6A has a cover opening 61A for exposing a heat radiation surface of the second heat-transfer member 3A, inner flange 62A extending around the cover opening, and an outer flange 64A used to make contact with a top end of the sidewall 52A through a sealing material (not shown). The numeral 63A designates a through-hole for the use of the bolt 4A.

By use of the case 5A and cover 6A, the present apparatus can be assembled according to the following procedure. First, as shown in FIG. 6C, the heat insulation board 70A is put on the base projections 54A of the case 5A. Then, the common first heat-transfer member 2A is disposed in the case 5A such that the projections 22A contact the heat insulation board 70A. Therefore, the heat insulation board 70A is put between the projections 22A and the base projections 54A. In addition, a second heat insulator 75A is disposed between the guide wall 56A and the heat insulation board 70A.

Then, the thermo-module 1A is placed on the first heat-transfer member 2A through a silicon compound. In addition, the second heat-transfer member 3A is placed on the thermo-module 1A through the silicon compound. A first heat insulator 71A is disposed around a convex 31A of the second heat-transfer member 3A so as to be spaced from the second heat-transfer member by a predetermined distance.

Then, the top opening 53A of the case 5A is closed by the cover 6A, so that a heat radiation surface 32A of the second heat-transfer member 3A is exposed to the outside through the cover opening 61A, and the inner flange 62A of the cover 6A is pressed against a flange 30A of the second heat-transfer member 3A through the sealing material 55A having elasticity. In addition, the outer flange 64A of the cover is pressed against the top end of the sidewall 52A of the case 5A through a sealing material (not shown). The first heat-transfer member 2A and the thermo-module 1A of the temperature control unit are disposed in an enclosed space between the case and the cover. It is preferred that the enclosed space is filled with an inert gas.

Finally, the bolts 4A securely hold the cover 6A to the case 5A. The bolts 4A are engaged to the screw holes 58A of the case through the through-holes 63A of the cover. Thus, the temperature control unit is stably held by use of the cover and the case.

The apparatus of the first embodiment is of a straight-flow structure, in which the fluid flows in one direction. In this embodiment, as shown by the arrows in FIG. 6B, the apparatus is of a turn-flow structure. That is, the fluid is supplied to a first header 91A disposed in the case 5A through a fluid inlet 90A. The first header 91A provides the fluid to two of four channels 20A of the first heat-transfer member 2A. By flowing the fluid from the first header 91A toward a second header 92A through the two channels 20A, the fluid is cooled. Heat of the fluid is absorbed by the heat absorption side of the thermo-module 1A through the first heat-transfer member 2A. On the contrary, heat generated from the heat-radiation side of the thermo-module 1A is radiated through the second heat-transfer member 3A to the outside.

The second header 92A provides the fluid to the remaining two channels 20A of the heat-transfer member 2A. By flowing the fluid from the second header 92A toward the first header 91A through the remaining two channels 20A, the fluid is cooled again. As a result, the fluid is cooled eight times by the temperature control units. The cooled fluid is provided to the outside of the apparatus through a fluid outlet 93A.

In this embodiment, since the thermo-module 1A is disposed on only one side of the first heat-transfer member 2A in each of the temperature control units, a cooling efficiency for one temperature control unit is lower than that of the first embodiment. However, since the apparatus of this embodiment is of the turn-flow structure, the fluid can be cooled a greater number of times by the temperature control units to improve the cooling efficiency. In addition, since the apparatus of this embodiment has a reduced height dimension, as compared to the apparatus of the first embodiment, there is an advantage of providing a more compact apparatus of the present invention.

Figure 7A:
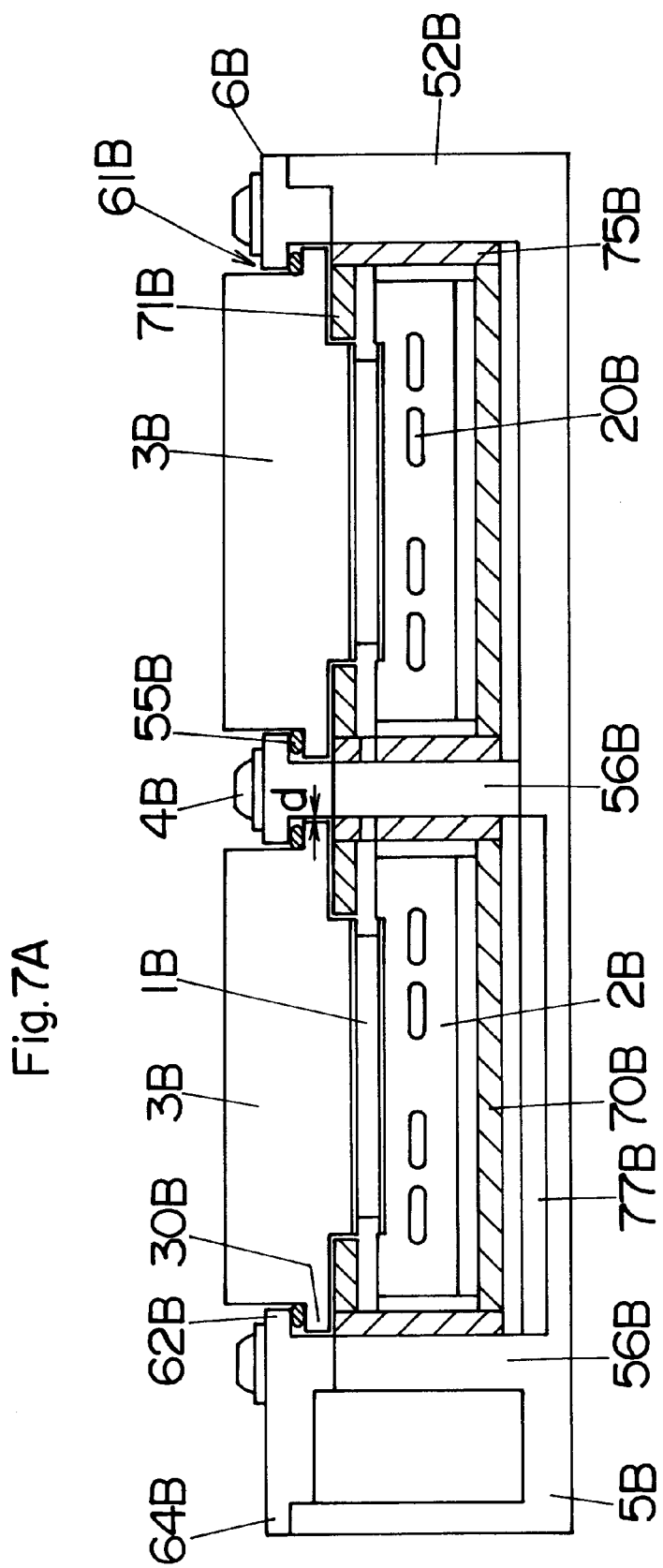
FIGS. 7A to 7C are respectively cross-sectional view, cutaway top and side views of an apparatus for controlling the temperature of a fluid according to a modification of the second embodiment of the present invention.
Figure 7B:
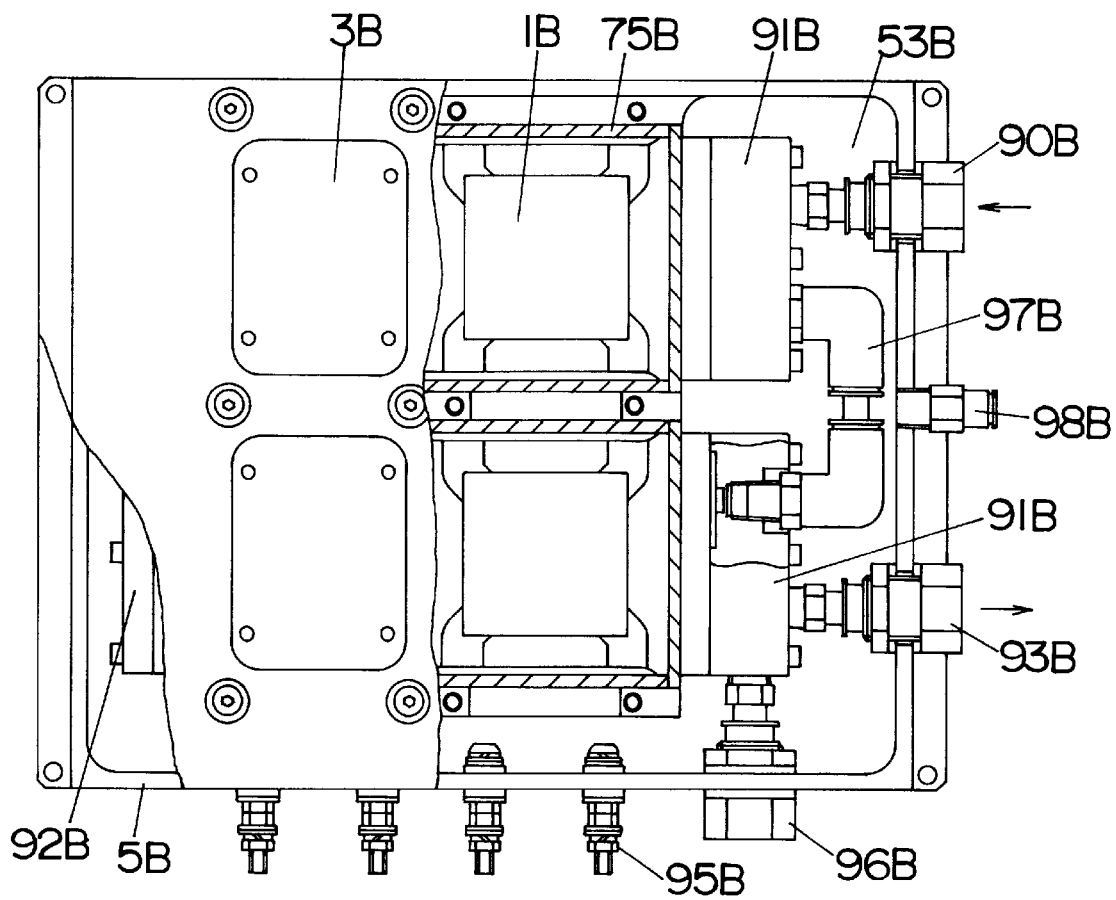
Figure 7C:
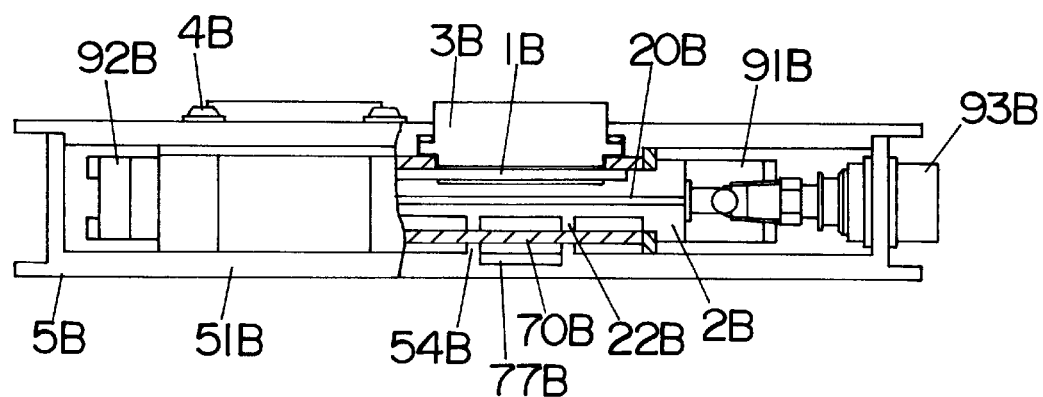

As shown in FIGS. 7A to 7C, an apparatus according to a modification of this embodiment is of a turn-flow structure having a pair of unit arrays, in each of which two temperature control units are arranged in series. In this case, the fluid can be cooled eight times by the temperature control units in the interim that the fluid supplied into the apparatus through a fluid inlet 90B reaches a fluid outlet 93B. In FIG. 7B, the numeral 97B designates a coupler for connecting between first headers 91B. In FIG. 7C, the numeral 77B designates a storage space for lead wires of the thermo-modules 1B. The storage space 77B is useful to easily carry out the necessary wiring between the thermo-modules 1B, and reduce the apparatus size. The structure of the respective temperature control unit is substantially the same as that of the above embodiment. Therefore, no duplicate explanation to common parts is deemed necessary.

The apparatus according to the first and second embodiments has the following advantages.

(1) In the installed state of the temperature control unit, a contact pressure between the second heat-transfer member (3, 3A, 3B) and the thermo-module (1, 1A, 1B) and the contact pressure between the thermo-module and the first heat-transfer member (2, 2A, 2B) are provided by repulsion of the sealing material (55, 55A, 55B). Therefore, even when a thermal stress occurs in the temperature control unit during the operation of the apparatus, the sealing material receives the vertical component of the thermal stress to stably keep those contact pressures.

In addition, except that the flange (30, 30A, 30B) of the second heat-transfer member contacts the inner flange (62, 62A, 62B) of the cover (6, 6A, 6B) through the sealing material, a required clearance "d" is created between the second heat-transfer member and the inner surface of the cover. In the apparatus of the first embodiment, the required clearance "d" is also created between the second heat-transfer member and the inner surface of the case 5 except that the flange 30 of the second heat-transfer member contacts the base flange 57 of the case through the sealing material 55. By the formation of the clearance "d", the second heat-transfer member slidably contacts the thermo-module in a direction parallel to the contact plane between the second heat-transfer member and the thermo-module.

On the other hand, the thermo-module is disposed to be spaced from the first heat insulator (71, 71A, 71B) by a required clearance. Therefore, the thermo-module slidably contacts the first heat-transfer member in a direction parallel to the contact plane between the thermo-module and the first heat-transfer member. Thus, the temperature control unit is held between the case and the cover such that the thermo-module slidably contacts the first and second heat-transfer members, respectively. Therefore, even when the thermal stress occurs in the temperature control unit during the operation of the apparatus, the horizontal components of the thermal stress can be released. Thus, the holding mechanism of the present invention for the temperature control unit is suitable to protect the thermo-module from the thermal stress.

(2) The temperature control unit can be easily assembled by vertically stacking their parts in the order described above in the case, and then securing the cover to the case by the bolts. This provides an improved manufacturability of the apparatus.

By the way, in the apparatus of this type, it is necessary to design parts used to hold the temperature control unit in consideration of thermal expansions of the thermo-module and the second heat-transfer member occurring during the operation of the apparatus. Therefore, as the number of the parts increases, a higher degree of accuracy is required for the individual part. In the above embodiments, only two parts, i.e., the case and the cover, are needed to stably hold the temperature control unit. Therefore, since the number of the parts is reduced, the production of the parts and the control of quality of the parts become easier. Moreover, there is an advantage that the thermo-module can be easily exchanged by removing the cover from the case without a cumbersome task.

(3) When the present apparatus is used to cool the fluid, the temperature of the air around the first heat-transfer member and the heat-absorption side of the thermo-module decreases, so that condensation or ice covering may be caused. These become a cause of breakage of the thermo-module. In the present invention, since the thermo-modules and the first heat-transfer member are disposed in the enclosed space between the case and the cover, and the enclosed space is preferably filled with an inert gas such as nitrogen, it is possible to solve the problem of condensation or ice covering. If necessary, a suitable sealing material may be used at the fluid inlet and outlet formed in the case, through-holes for use of the bolts formed in the cover and so on.

(4) Since the heat-radiation surface of the second heat-transfer member is exposed to the outside of the apparatus, various kinds of heat-recapturing units for efficiently removing heat radiated from the thermo-module are available. That is, a suitable heat-recapturing unit can be used without concern for dimensional constraints, and easily mounted on the heat-radiation surface of the second heat-transfer member. Thus, a high degree of flexibility in apparatus configuration is achieved.

Third Embodiment

Figure 8A:
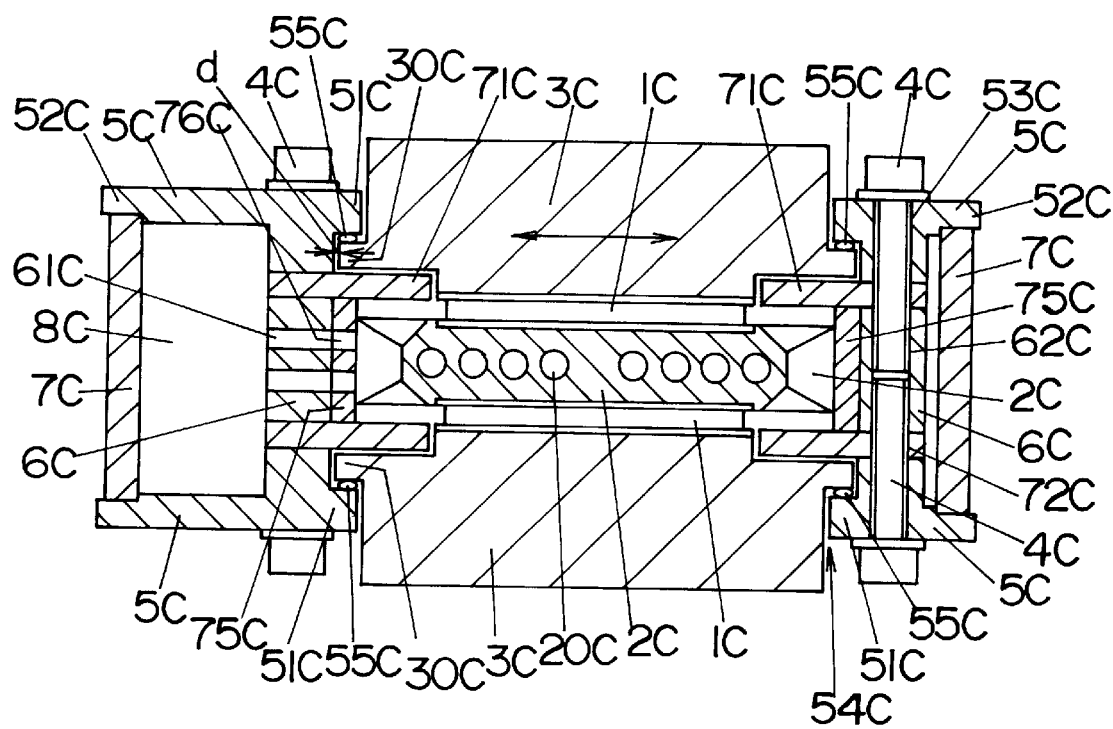

As shown in FIGS. 8A to 8C, an apparatus for controlling the temperature of a fluid according to a third embodiment of the present invention has a plurality of temperature control units in series. Each of the temperature control units is substantially the same structure as that of the first embodiment. Therefore, no duplicate explanation to common parts is deemed necessary. The apparatus of this embodiment uses a pair of upper and lower holding frames 5C, coupling member 6C having screw holes 62C, and a sidewall member 7C extending around the temperature control unit and between the holding frames. Each of the holding frames 5C is formed with an aperture 54C, first flange 51C, and a second flange 52C. The numeral 53C designates a screwhole for the use of a bolt 4C. The coupling member 6C is disposed between the holding frames 5C.

The first flange 51C of the upper holding frame 5C is pressed against a flange 30C of the upper one of second heat-transfer members 3C through a sealing material 55C having elasticity. A first heat insulator 71C is disposed in a space between a first heat-transfer member 2C and the second heat-transfer member 3C so as to be spaced from the second heat-transfer member 3C by a predetermined distance. The first heat insulator 71C has through-holes 72C for the use of the bolts 4C. Therefore, the upper holding frame 5C is secured to the coupling member 6C through the first heat insulator 71C by the bolts 4C.

Similarly, the first flange 51C of the lower holding frame 5C is pressed against the flange 30C of the lower one of second heat-transfer members 3C through the sealing material 55C having elasticity. The lower holding frame 5C is secured to the coupling member 6C through the first heat insulator 71C by the bolts 4C. Thus, the upper holding frame is coupled to the lower holding frame by use of the coupling member 6C. In addition, a second heat insulator 75C is disposed between the first heat-transfer member 2C and the coupling member 6C. The temperature control unit is stably held between the upper and lower holding frames 5C such that each of thermo-modules 1C slidably contacts the first and second heat-transfer members, respectively.

From the same reasons described as to the apparatus according to the first and second embodiments, the holding mechanism for the temperature control unit of this embodiment is suitable to protect the thermo-module from the thermal stress.

The sidewall member 7C is disposed between the holding frames 5C such that the second flanges 52C of the upper and lower holding frames are respectively pressed against top and bottom ends of the sidewall member through a sealing material (not shown). The sidewall member 7C is shaped to extend around the temperature control units in series, as shown in FIG. 8B. The sidewall member 7C makes an enclosed space in cooperation with the holding frames 5C, sealing material 55C and the second heat-transfer members 3C, so that the first heat-transfer member 2C and the thermo-modules 1C of the temperature control units are disposed in the enclosed space. The enclosed space is preferably filled with an inert gas such as nitrogen.

In FIG. 8A, the numerals 61C and 76C designate through-holes formed in the coupling member 6C and the second heat insulator 75C, respectively, to draw lead wires (not shown) of the thermo-modules 1C. The numeral 8C designates a space used to connect the lead wires of the thermo-modules 1C with the terminals 95C.

Figure 9A:
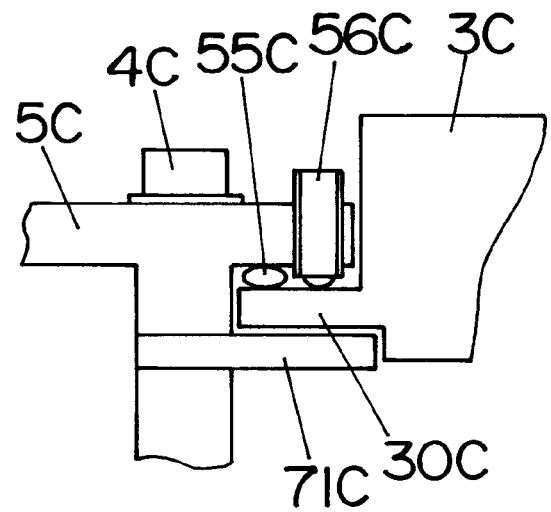
FIGS. 9A and 9B are partially cross-sectional views of holding frames according to modifications of the third embodiment.
Figure 9B:
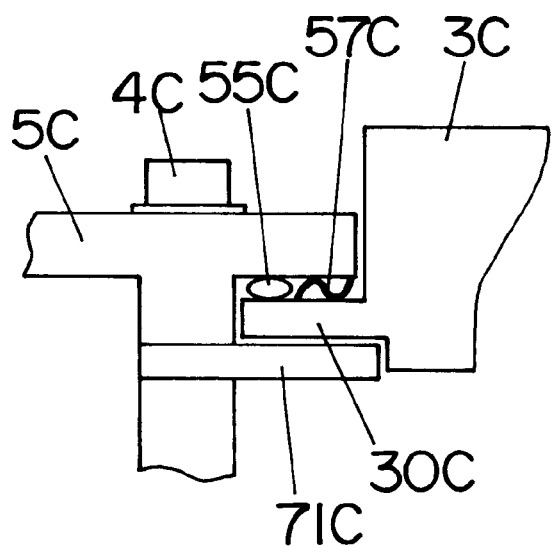
Figure 10:
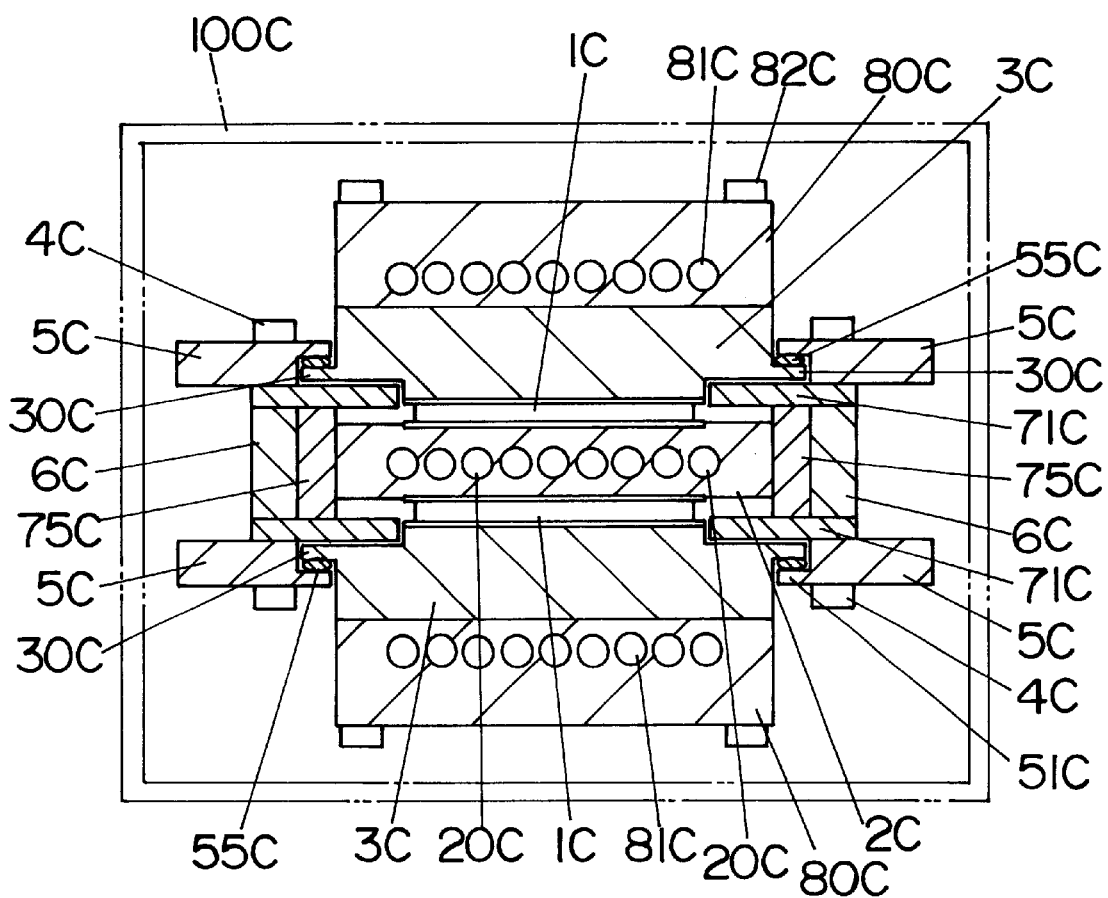
FIG. 10 is a cross-sectional view of an apparatus for controlling the temperature of a fluid according to a further modification of the third embodiment.

As a first modification of the third embodiment, as shown in FIG. 9A, it is possible to use a holding frame 5C having a pressurizing unit 56C such as a ball plunger or a spring plunger, that is disposed adjacent to the sealing material 55C. In addition, as a second modification of the third embodiment, it is preferred to use a wave washer 57C, coned-disc spring or the like, which is disposed adjacent to the sealing material 55C and between the holding frame 5C and the second heat-transfer member 3C, as shown in FIG. 9B As shown in FIG. 10, in place of the sidewall member 7C, it is possible to dispose the temperature control units held between the holding frames 5C in an airtight enclosure 100C. In FIG. 10, the numeral 80C designates a heat-recapturing unit using water as a coolant, which is placed on a heat-radiation surface of the second heat-transfer member 3C of the temperature control unit. This heat-recapturing unit 80C has a plurality of channels 81C for flowing the coolant. The numeral 82C designates a fixture for securing the heat-recapturing unit 80C to the second heat-transfer member 3C.

Fourth Embodiment

Figure 11:
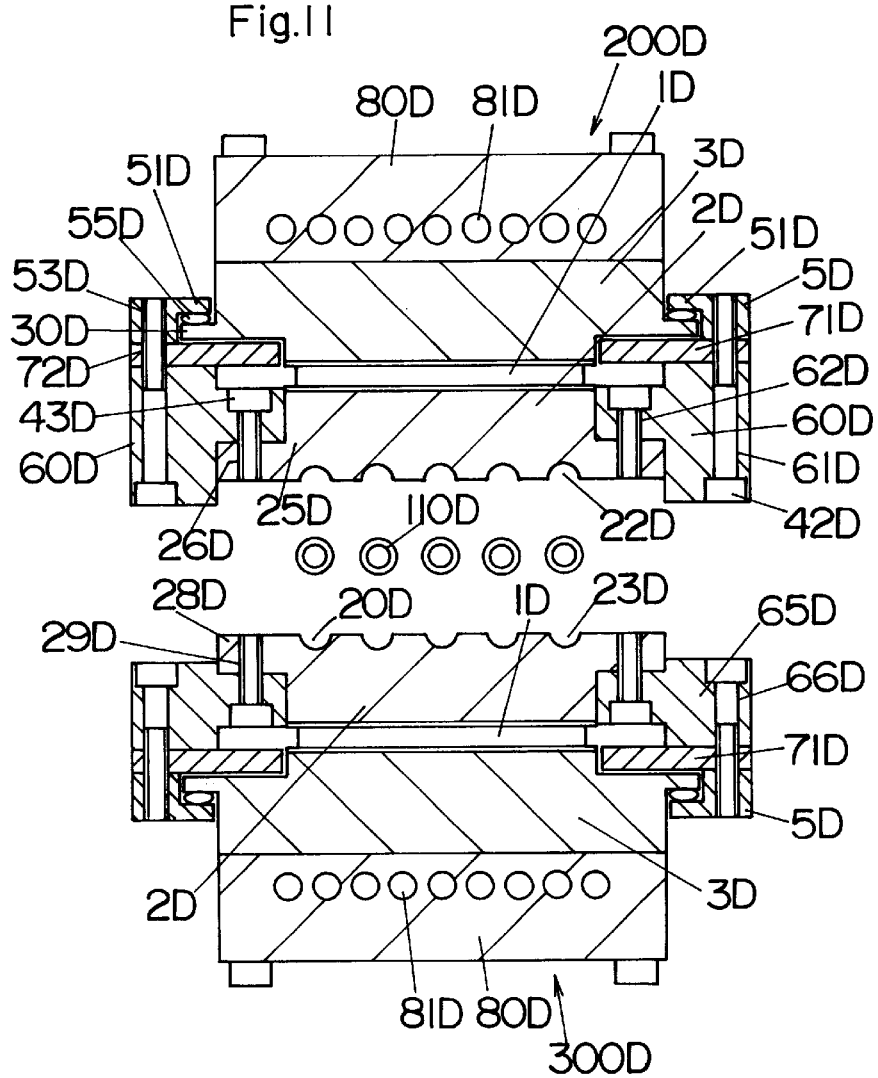
FIG. 11 is a cross-sectional view of an apparatus for controlling the temperature of a fluid according to a fourth embodiment of the present invention.
Figure 16:
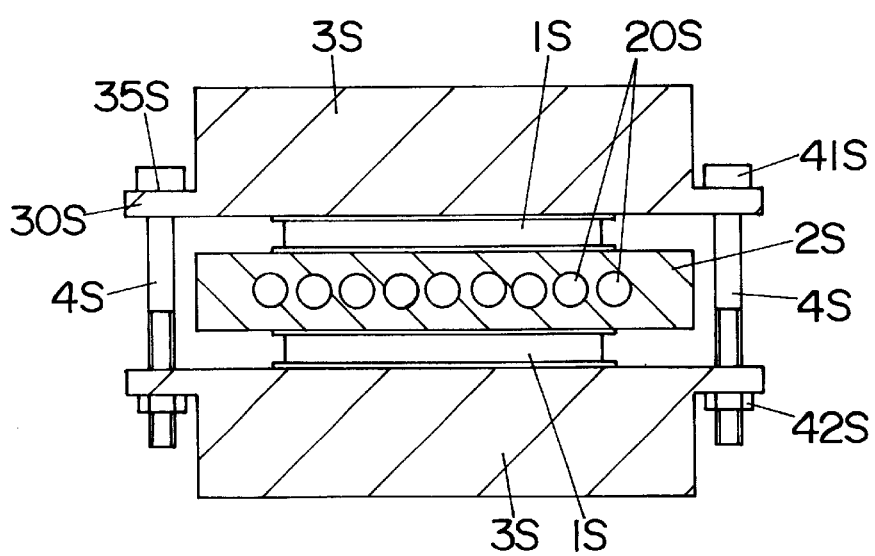
FIG. 16 is a cross-sectional view of a conventional apparatus for controlling the temperature of a fluid by use of a thermoelectric device.

As shown in FIG. 11, an apparatus for controlling the temperature of a fluid according to a fourth embodiment of the present invention comprises a temperature control unit, which is composed of upper and lower subunits 200D, 300D. That is, this embodiment is characterized in that a first heat-transfer member 2D can be separated into two heat-transfer blocks 25D, 28D.

The upper subunit 200D comprises the heat-transfer block 25D, a thermo-module 1D placed on the heat-transfer block through a silicon compound, and a second heat-transfer member 3D placed on the thermo-module through a silicon compound.

The upper subunit 200D is held by use of a holding frame 5D and an upper holding block 60D made of a heat insulation material. That is, a flange 51D of the holding frame 5D is pressed against a flange 30D of the second heat-transfer member 3D through a sealing material 55D having elasticity. The upper holding block 60D is shaped to fit a side of the heat-transfer block 25D. The upper holding block 60D has first through-holes 61D for the use of bolts 42D and second through-holes 62D for the use of bolts 43D. Each of the bolts 42D engages in a screw hole 53D of the holding frame 5D through the first through-hole 61D of the upper holding block 60D and a through-hole 72D of a first heat insulator 71D, to thereby secure the holding frame 5D to the upper holding block 60D.

On the other hand, each of the bolts 43D engages in a screw hole 26D of the heat-transfer block 25D through the second through-hole 62D of the upper holding block 60D, to thereby secure the upper holding block to the heat-transfer block 25D. The thermo-module 1D slidably contacts the heat-transfer block 25D and the second heat-transfer member 3D, respectively, under a contact pressure provided by repulsion of the sealing material 55D. Thus, the upper subunit 200D is stably held by use of the holding frame 5D and the upper holding block 60D. The upper holding block 60D has a height dimension to provide a recessed area of the upper subunit 200D, which exposes a surface having a plurality of grooves 22D of the heat-transfer block 25D.

According to the similar manner to the above, the lower subunit 300D is stably held by use of the holding frame 5D and a lower holding block 65D. The lower holding block 65D has a height dimension to provide a projected area of the lower subunit 300D, which exposes a surface having a plurality of grooves 23D of the heat-transfer block 28D. In FIG. 11, the numeral 66D designates a through-hole formed in the lower holding block 65D, which is used to secure the lower holding block to the holding frame 5D by the use of a bolt. The numeral 29D designates a screw hole formed in the heat-transfer block 28D, which is used to secure the lower holding block 65D to the heat-transfer block 28D by the use of a bolt.

The upper subunit 200D is coupled with the lower subunit 300D such that the grooves 22D, 23D of the heat-transfer blocks 25D, 28D coalesce into channels 20D of the first heat-transfer member 2D. Tubes 110D are disposed in the channels 20D such that an outer surface of the respective tube tightly fits the grooves of the heat-transfer blocks. The use of the tubes 110D is preferable in such a case that notice must always be taken of the cleanliness of a fluid to be cooled, such as a blood, drinking water, or the like.

In FIG. 11, the numeral 80D designates a heat-recapturing unit using water as a coolant, which is placed on a heat-radiation surface of the second heat-transfer member 3D of the temperature control unit. This heat-recapturing unit 80D has a plurality of channels 81D for flowing the coolant. In this embodiment, as shown in FIG. 11, the heat-recapturing unit 80D is disposed such that a flow direction of the coolant is substantially parallel to the flow direction of the fluid to be cooled. As a modification, the heat-recapturing unit 80D may be disposed such that the flow direction of the coolant is substantially perpendicular to the flow direction of the fluid to be cooled.

Fifth Embodiment

An apparatus for controlling the temperature of a fluid according to a fifth embodiment of the present invention has five temperature control units in series. Each of the temperature control units is substantially the same structure as the first embodiment. Therefore, no duplicate explanation to common parts is deemed necessary.

Figure 12:
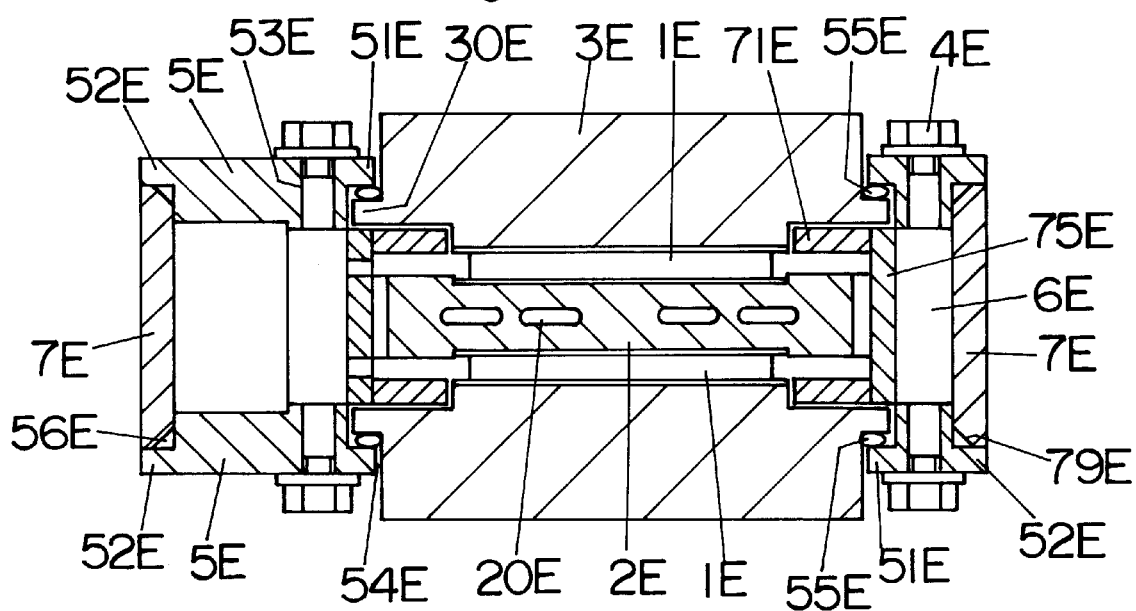
FIG. 12 is a cross-sectional view of an apparatus for controlling the temperature of a fluid according to a fifth embodiment of the present invention.
Figure 13:
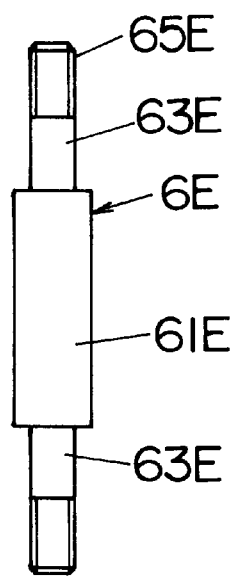
FIG. 13 is a plan view of a coupling member used in the fifth embodiment.

As shown in FIG. 12, the apparatus of this embodiment is characterized in that coupling members 6E and nuts 4E are used to couple between upper and lower holding frames 5E. As shown in FIG. 13, the coupling member 6E is of nearly identical shape with stud bolt, and formed with a thick-rod portion 61E and thin-rod portions 63E projecting from the opposite ends of the thick-rod portion. Each of the thin-rod portions has a screw thread 65E for the nut 4E. FIGS. 14A and 14B show top and side views of the lower holding frame 5E, respectively. The lower holding frame 5E is formed with an aperture 54E, first flange 51E, and a second flange 52E. The upper and lower holding frames are mirror images of each other. The numeral 53E designates a through-hole for the use of the coupling member 6E.

FIGS. 15A and 15B show top and side view of a sidewall member 7E, respectively. The sidewall member 7E is shaped to extend along the perimeter of the holding frame 5E, as understood from FIGS. 14A and 15A. The numeral 78E designates through-holes formed in the sidewall member, to which terminals (not shown) are attached. Electric wires of thermo-modules 1E are connected to the terminals. From the viewpoints of electrical insulation between the terminals, it is preferred that the sidewall member 7E is made of an electrical insulating resin material such as engineering plastics.

A flange 30E of a second heat-transfer member 3E of the temperature control unit is pressed against the first flange 51E of the holding frame 5E through a sealing material 55E having elasticity. Each of top and bottom end surfaces 79E of the sidewall member 7E is pressed against the second flange 52E of the holding frame 5E through a sealing material 56E having elasticity. Arrangements of first and second heat insulators 71E, 75E are substantially the same as of the first embodiment.

As described before, the holding frames 5E are coupled by the use of the coupling members 6E and the nuts 7E, to thereby stably hold the temperature control units therebetween. A length of the thick-rod portion 61E of the coupling member is determined such that the temperature control unit receives a suitable holding pressure through the sealing material 55E when tightening the nuts 4E is finished. In other words, since the thick-rod portion 61E of the coupling member 6E acts as a stopper for preventing overtightening the nuts 4E, it is possible to prevent the occurrence of an excessive holding pressure in the temperature control unit. In addition, the sidewall member 7E makes an enclosed space in cooperation with the holding frames 5E, sealing material 55E and the second heat-transfer members 3E, so that a first heat-transfer members 2E having channels 20E, through which the fluid flows, and the thermo-modules 1E of the temperature control units are disposed in the enclosed space. The enclosed space is preferably filled with an inert gas such as nitrogen.

From the same reasons described as to the apparatus according to the first and second embodiments, the holding mechanism for the temperature control unit of this embodiment is suitable to protect the thermo-module from the thermal stress and solve the problem of condensation or ice covering.

In conclusion, since the apparatus using the thermoelectric device is capable of precisely controlling the temperature of the fluid without chlorofluorocarbons (CFCs) used as a coolant for conventional refrigerators, it is expected as a cooling means of the next generation from the viewpoint of the global environmental protection. As described in the above embodiments, the apparatus of the present invention can provide high degrees of reliability and flexibility in apparatus configuration, while solving the problems of thermal stress and condensation.

What is claimed is:

1. An apparatus for controlling temperature of a fluid by use of a thermoelectric device, said apparatus comprising:
   at least one temperature control unit comprising a first heat-transfer member having at least one channel, through which the fluid flows, a thermo-module incorporating said thermoelectric device, which is placed on said first heat-transfer member, and a second heat-transfer member having a flange on its periphery, which is placed on said thermo-module;
   a case having an opening, through which said temperature control unit is mounted in said case; and
   a cover for closing the opening of said case;
   wherein one of said case and said cover is formed with an aperture for exposing a part of said second heat-transfer member, and a first flange extending around said aperture, which is pressed against the flange of said second heat-transfer member through a sealing material having elasticity, and
   wherein said first heat-transfer member and said thermo-module of said temperature control unit are disposed in an enclosed space between said case and said cover, and
   wherein said temperature control unit is held such that said thermo module slidably contacts said first and second heat-transfer members, respectively.

2. The apparatus as set forth in claim 1, further comprising a heat insulator disposed between said first heat-transfer member and said case.

3. The apparatus as set forth in claim 1, wherein the enclosed space is filled with an inert gas.

4. The apparatus as set forth in claim 1, wherein said case has a fluid inlet, through which the fluid is supplied into the channel of said first heat-transfer member, and a fluid outlet, through which a temperature-controlled fluid is provided.

5. The apparatus as set forth in claim 1, further comprising a first heat insulator disposed between said first and second heat-transfer members and around said thermo-module in the enclosed space.

6. The apparatus as set forth in claim 1, further comprising a second heat insulator disposed around said first heat-transfer member in the enclosed space.

7. An apparatus for controlling temperature of a fluid by use of a thermoelectric device, said apparatus comprising:
   at least one temperature control unit comprising a first heat-transfer member having at least one channel, through which the fluid flows, a pair of thermo-modules each incorporating said thermoelectric device, which are placed on opposite surfaces of said first heat-transfer member, and a pair of second heat-transfer members, each of which has a flange on its periphery and is placed on said thermo-module;
   a case having an opening, through which said temperature control unit is mounted in said case; and
   a cover for closing the opening of said case;
   wherein said case is formed with a first aperture for exposing a part of one of said second heat-transfer members, and a first flange extending around the first aperture, which is pressed against the flange of one of said second heat-transfer members through a sealing material having elasticity,
   said cover is formed with a second aperture for exposing a part of the other one of said second heat-transfer members, and a second flange extending around the second aperture, which is pressed against the flange of the other one of said second heat-transfer members through a sealing material having elasticity, and
   wherein said first heat-transfer member and said thermo-modules of said temperature control unit are disposed in an enclosed space between said case and said cover.

8. The apparatus as set forth in claim 7, wherein the enclosed space is filled with an inert gas.

9. The apparatus as set forth in claim 7, wherein said case has a fluid inlet, through which the fluid is supplied into the channel of said first heat-transfer member, and a fluid outlet, through which a temperature-controlled fluid is provided.

10. The apparatus as set forth in claim 7, further comprising a first heat insulator disposed between said first and second heat-transfer members and around said thermo-module in the enclosed space.

11. The apparatus as set forth in claim 7, further comprising a second heat insulator disposed around said first heat-transfer member in the enclosed space.

12. The apparatus as set forth in claim 7, wherein said temperature control unit is held such that said thermo module slidably contacts said first and second heat-transfer members, respectively.

13. An apparatus for controlling temperature of a fluid by use of a thermoelectric device, said apparatus comprising:
   at least one temperature control unit comprising a first heat-transfer member having at least one channel, through which the fluid flows, a pair of thermo-modules each incorporating said thermoelectric device, which are placed on opposite surfaces of said first heat-transfer member, and a pair of second heat-transfer members, each of which has a flange on its periphery and is placed on said thermo-module; and
   a pair of holding frames each having an aperture;

wherein said temperature control unit is held between said holding frames such that each of said holding frames is pressed against the flange of said second heat-transfer member through a sealing material having elasticity, and a part of said second heat-transfer member is exposed through said aperture.

14. The apparatus as set forth in claim 13 further comprising a sidewall member extending between said holding frames and around said temperature control unit, wherein said sidewall member makes an enclosed space in cooperation with said holding frames, said sealing material and said second heat-transfer members, so that said first heat-transfer member and said thermo-modules of said temperature control unit are disposed in the enclosed space.

15. The apparatus as set forth in claim 14, wherein the enclosed space is filled with an inert gas.

16. The apparatus as set forth in claim 13, further comprising a first heat insulator disposed between said first and second heat-transfer members and around said thermo-module in the enclosed space.

17. The apparatus as set forth in claim 13, further comprising a second heat insulator disposed around said first heat-transfer member in the enclosed space.

18. The apparatus as set forth in claim 13, wherein said temperature control unit is held such that said thermo module slidably contacts said first and second heat-transfer members, respectively.

* * * * *